United States Patent

Huang

(10) Patent No.: US 8,253,504 B2
(45) Date of Patent: Aug. 28, 2012

(54) ELECTRONICALLY VARIABLE OSCILLATOR

(75) Inventor: Qiuting Huang, Zollikon (CH)

(73) Assignee: ACP Advanced Circuit Purcuit AG, Zollikon (CH)

( * ) Notice: Subject to any disclaimer, the term of this patent is extended or adjusted under 35 U.S.C. 154(b) by 0 days.

(21) Appl. No.: 12/735,065

(22) PCT Filed: Dec. 12, 2008

(86) PCT No.: PCT/IB2008/003705
§ 371 (c)(1),
(2), (4) Date: Jun. 10, 2010

(87) PCT Pub. No.: WO2009/077856
PCT Pub. Date: Jun. 25, 2009

(65) Prior Publication Data
US 2010/0253441 A1    Oct. 7, 2010

(30) Foreign Application Priority Data
Dec. 14, 2007 (GB) .................................. 0724475.9

(51) Int. Cl.
*H03B 5/36* (2006.01)
(52) U.S. Cl. .................. 331/116 FE; 331/156; 331/181
(58) Field of Classification Search .................. 331/180, 331/36 R, 181, 36 L, 116 R, 116 FE, 158; 334/11, 14, 15, 71; 327/553
See application file for complete search history.

(56) References Cited

U.S. PATENT DOCUMENTS

| | | | |
|---|---|---|---|
| 5,596,301 A * | 1/1997 | Rybicki et al. | 331/36 R |
| 6,172,574 B1 | 1/2001 | Sirito-Olivier | |
| 6,294,964 B1 * | 9/2001 | Satoh | 331/116 R |
| 7,187,240 B2 * | 3/2007 | Cathelin et al. | 331/2 |

FOREIGN PATENT DOCUMENTS

| | | |
|---|---|---|
| DE | GB 1 472 884 A | 5/1977 |
| EP | 1 128 554 A | 8/2001 |
| FR | 2 758 919 A1 | 7/1998 |

OTHER PUBLICATIONS

PCT International Search Report and Written Opinion in related PCT Application No. PCT/IB2008/003705 dated Jun. 25, 2009.
Sharman R. et al., "Design Approach for Tune able CMOS Active Inductor", Semiconductor Electronics, 2004, ICSE 2004. IEEE International Conference on, IEEE, Piscataway, NJ, USA, Dec. 7, 2004, pp. 143-147, XP010910260, ISBN: 978-0-7803-8658-7, p. 144, left-hand column, lines 1-3; figure 2.

(Continued)

*Primary Examiner* — Ryan Johnson
(74) *Attorney, Agent, or Firm* — Stout, Uxa, Buyan & Mullins; Frank J. Uxa

(57) ABSTRACT

A variable simulated inductor comprises an integrator connected to receive the voltage across the input to the circuit. The output of the inductor is connected to a control terminal of a transconductor connected across the input of the circuit. The gain of the transconductor is electronically controllable in order to control the inductance of the circuit. An oscillator using a variable simulated inductor and a piezoelectric resonator connected in parallel is also provided.

8 Claims, 12 Drawing Sheets

OTHER PUBLICATIONS

Grozing M. et al., "A 2.5 V CMOS Differential Active Inductor with Tunable L and Q for Frequencies up to 5 GHz", 2001 IEEE MTT-S International Microwave Symposium Digest. (IMS 2001) Phoenix AZ, May 20-25, 2001. [IEEE MTTS International Microwave Symposium] New York, NY: IEEE, US, May 20, 2001, pp. 575-578, XP001067345, ISBN: 978-0-7803-6538-4, p. 576, right-hand column, lines 13-16, figure 2.

El Khoury S, "The Design of Active Floating Positive and Negative Inductors in MMIC Technology", IEEE Microwave and Guided Wave Letters, IEEE Inc., New York, US, vol. 5, No. 10, Oct. 1, 1995, pp. 321-323, XP000525038, ISSN: 1051-8207, figures 3b, 3d, 4b, 4d.

* cited by examiner

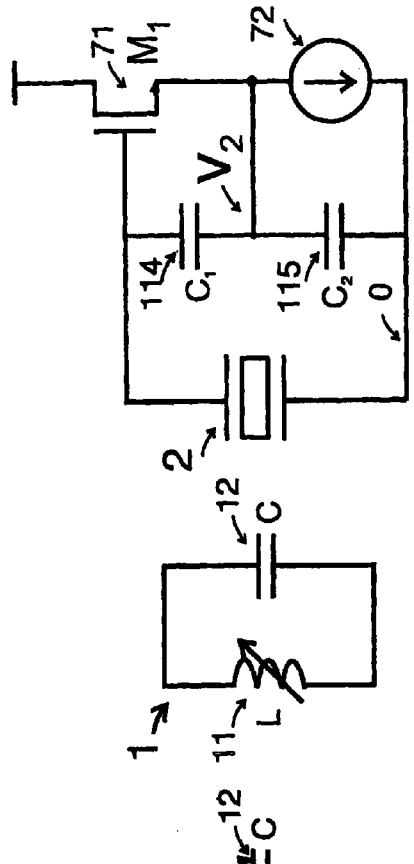
Figure 1a Prior Art
Figure 1b Prior Art
Figure 1c Prior Art
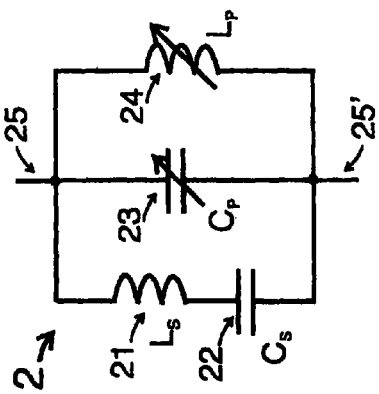
Figure 2a Prior Art
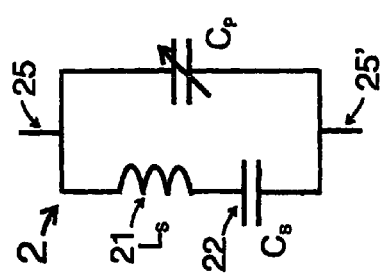
Figure 2b Prior Art
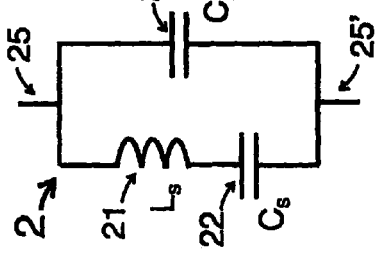
Figure 2c Prior Art
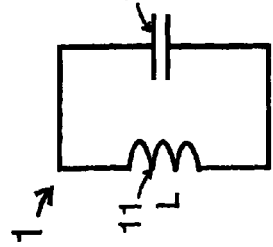
Figure 3

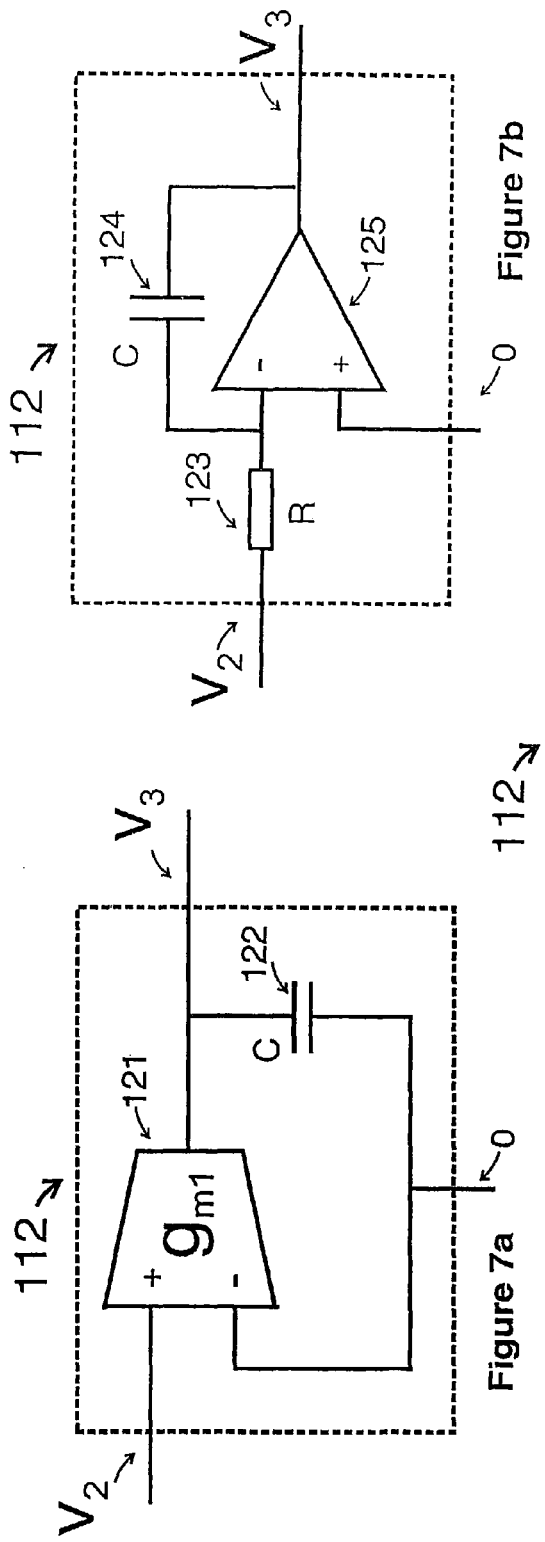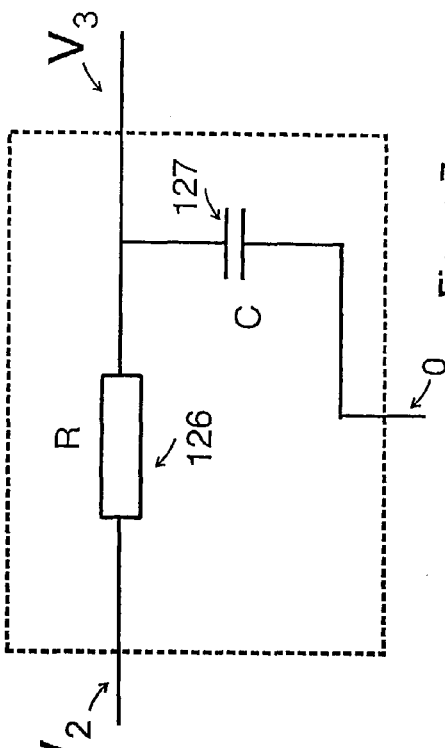
Figure 7a
Figure 7b
Figure 7c

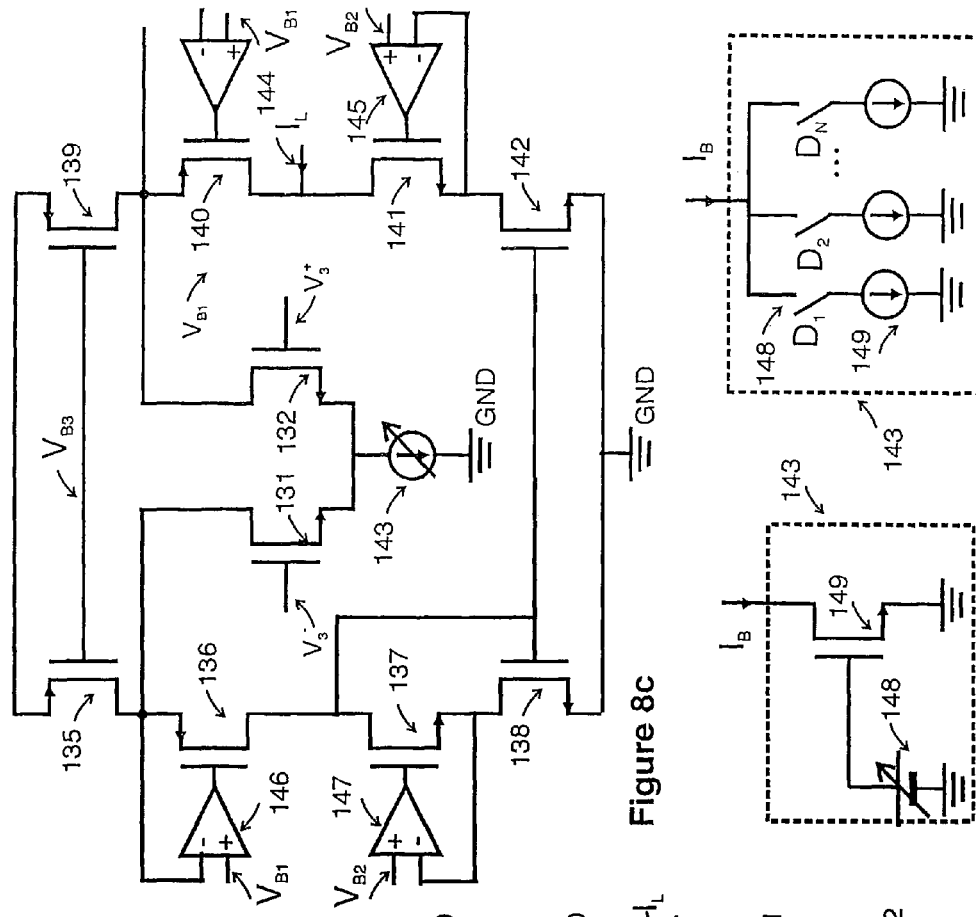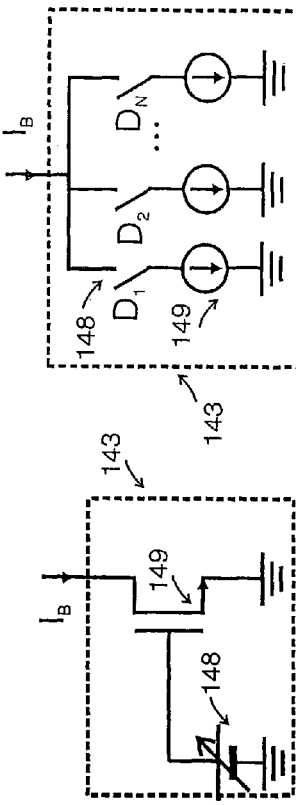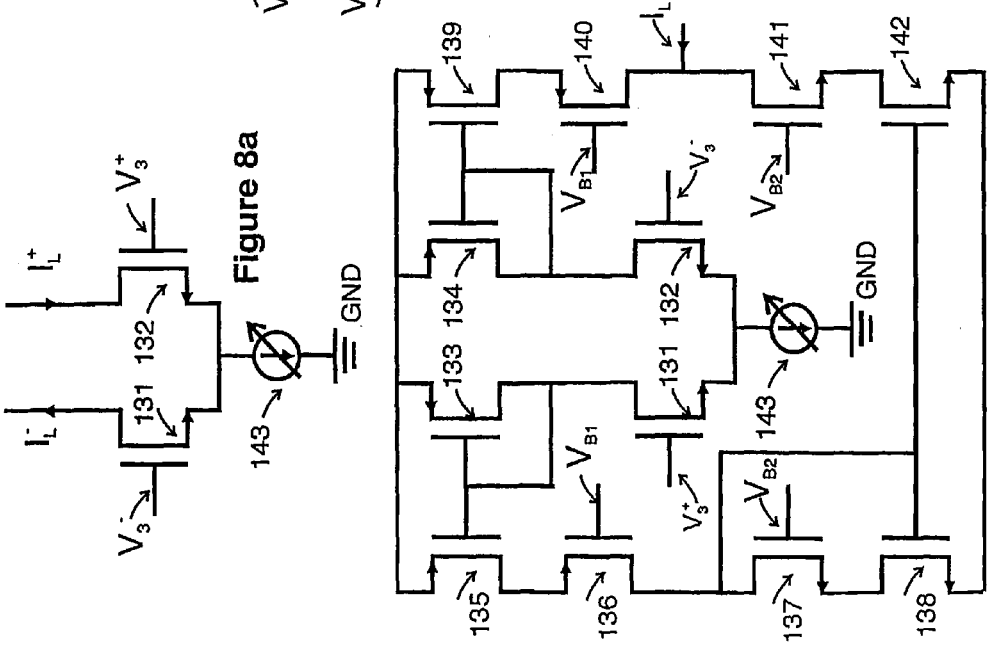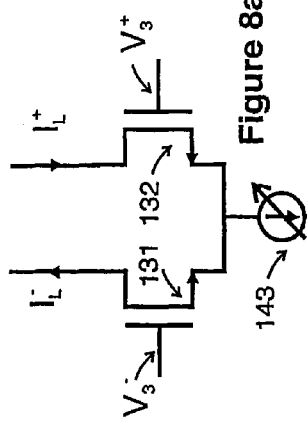

US 8,253,504 B2

ELECTRONICALLY VARIABLE OSCILLATOR

FIELD OF THE INVENTION

This invention relates to an electronically controlled variable inductor, which finds applications in a wide variety of analogue and radio frequency integrated circuits, including voltage-controlled oscillators.

BACKGROUND OF THE INVENTION AND RELATED ART

The combination of an inductor and a capacitor in a loop, typically known as a resonant circuit, is an important building block in electronic circuits. Oscillators, filters and impedances at the input or output of radio frequency (RF) amplifiers, for example, exploit the highly frequency-selective nature of resonant circuits to create, enhance or eliminate signals at particular frequencies. FIG. 1a shows a well-known resonant circuit 1, which comprises a single inductor 11 and a single capacitor 12 in a loop. The resonant frequency, at which the total impedance around the loop is zero, is inversely proportional to the square-root of the product between inductance L and capacitance C. In many applications, for example tunable filters and voltage-controlled oscillators, it is desirable to vary the resonant frequency. This can be achieved by varying either the capacitance 12 or the inductance 11, as shown in FIG. 1b and FIG. 1c, respectively. Although various mechanical means to vary or control the value of a capacitor or inductor have existed for some time, electronically variable capacitors, or varactors, are the most frequently used today in miniaturized systems such as an RF integrated circuit containing a voltage-controlled oscillator (VCO).

In electro-mechanical resonators based on a piezoelectric ceramic resonator or quartz crystal, a variable capacitor, found in oscillators such as that shown in FIG. 2a, is also sometimes used; the electrical equivalent circuit of the crystal is shown in FIG. 2b. The equivalent circuit comprises an inductance 21 and a capacitance 22 connected in series between the terminals of device in parallel with a second capacitance 23.

Although the equivalent capacitance in the resonator is the series combination of motional capacitance $C_s$ 22 and case capacitance $C_p$ 23, only the case capacitance is accessible from the crystal's two terminals 25 and 25', therefore its resonant frequency is controllable only by adding to it a variable capacitance in parallel, as shown in FIG. 2c. Control of the resonant frequency is desirable, to correct any inaccuracy in it due for example to manufacturing tolerances, temperature dependence and aging (In FIG. 2c $C_p$ represents the case capacitance and the variable capacitance, which are connected in parallel). A circuit containing such a crystal is usually called a voltage-controlled crystal oscillator (VCXO) and its frequency is set by using a varactor for the variable capacitor and varying the bias voltage varies its capacitance.

The motional capacitance $C_s$ in such resonators is typically several orders of magnitude smaller than the case capacitance $C_p$, so that increasing $C_p$ has limited effectiveness in decreasing the resonant frequency $f_p$, as can be seen from equation (1). Since the fixed part $$f_p = \frac{1}{2\pi\sqrt{L_s \frac{C_s C_P}{C_s + C_P}}} \quad (1)$$

$$= \frac{1}{2\pi\sqrt{L_s C_s}} \sqrt{1 + \frac{C_s}{C_P}}$$

of $C_p$ due to the casing of a ceramic or crystal resonator is usually already quite large, adding further variable capacitance to $C_p$ results in diminishing return in terms of relative frequency shift. (The right hand square root simply tends closer to 1). The tuning range of a voltage-controlled crystal oscillator (VCXO) is therefore typically limited.

SUMMARY OF THE INVENTION

According to the present invention there are provided a variable simulated inductor circuit and an electronically variable oscillator circuit as claimed in the appended claims.

The invention is of use, amongst other things, in mobile telephones or in any other kind of mobile terminal station, for example, PDAs with wireless mobile data connectivity or a similarly enabled laptop computer; in the latter case wireless connection is provided, for example, in a PC card, which may send data using GPRS, EDGE, or UMTS services.

Preferred embodiments of the present invention will now be described in greater detail, by way of example only, with reference to the accompanying drawings, of which:

FIG. 1a is a schematic diagram of a well-known LC resonator.

FIG. 1b is a schematic diagram of an LC resonator with a variable capacitor.

FIG. 1c is a schematic diagram of an LC resonator with a variable inductor.

FIG. 2a is a schematic diagram of an oscillator comprising an electro-mechanical resonator.

FIG. 2b is a schematic diagram of an LC resonator, which is also frequency used to describe the electrical equivalent of the electro-mechanical resonance of a quartz crystal.

FIG. 2c is a schematic diagram of an LC resonator as in FIG. 2b, in which the parallel capacitance is variable.

FIG. 3 is a schematic diagram of an LC resonator as in FIG. 2c, with an additional variable inductor in parallel with the variable capacitor.

FIG. 7a is the block diagram of a first exemplary implementation of the integrator.

FIG. 7b is the block diagram of a second exemplary implementation of the integrator.

FIG. 7c is the block diagram of a third exemplary implementation of the integrator.

FIG. 8a is the circuit schematic of a first exemplary implementation of the variable transconductor.

FIG. 8b is the circuit schematic of a second exemplary implementation of the variable transconductor.

FIG. 8c is the circuit schematic of a third exemplary implementation of the variable transconductor.

FIG. 8d shows an exemplary implementation of current source 143 of FIG. 8a.

FIG. 8e shows a further exemplary implementation of current source 143 of FIG. 8a.

DETAILED DESCRIPTION OF THE INVENTION

The circuit of FIG. 3 is a modified form of the resonator circuit shown in FIG. 2c in accordance with the first aspect of the invention. A variable inductor $L_p$ is connected in parallel to $C_p$. The admittance of the resulting combination is given by equation (2) when it is $$Y_p = j2\pi f_p C_p + \frac{1}{j2\pi f_p L_p} \quad (2)$$

$$= j2\pi f_p \left( C_p - \frac{1}{(2\pi f_p)^2 L_p} \right)$$

$$= j2\pi f_p C_p'$$

at or close to the resonant frequency $f_p$. As long as $C_p'$ is positive the combined impedance is capacitive, with the equivalent capacitance $C_p'$ smaller than $C_p$. When used in a VCXO the smaller equivalent parallel capacitance thus created extends the tuning range of the VCXO.

In FIG. 3 the capacitance $C_p$ is shown as a variable capacitance and, as explained above in relation to FIG. 2c, it comprises the case capacitance of the crystal 2 and an external variable capacitor connected in parallel. The external variable capacitor can be omitted or made fixed, leaving the tuning to the variable inductor 24, but this of course will reduce the range of tuning available.

While having a variable inductor provides the advantage of extending the tuning range, variable inductors generally have moving parts which would limit the applications of this circuit. This difficulty can be overcome by using an electronically controllable inductor.

A second aspect of the invention relates to a particular electrically controllable inductance, which can therefore be used in the oscillator of the first aspect of the invention, for example, as the inductor 24 in the crystal circuit of FIG. 3 (and hence also in any oscillator or other circuit needing an inductor).

Figure 4:
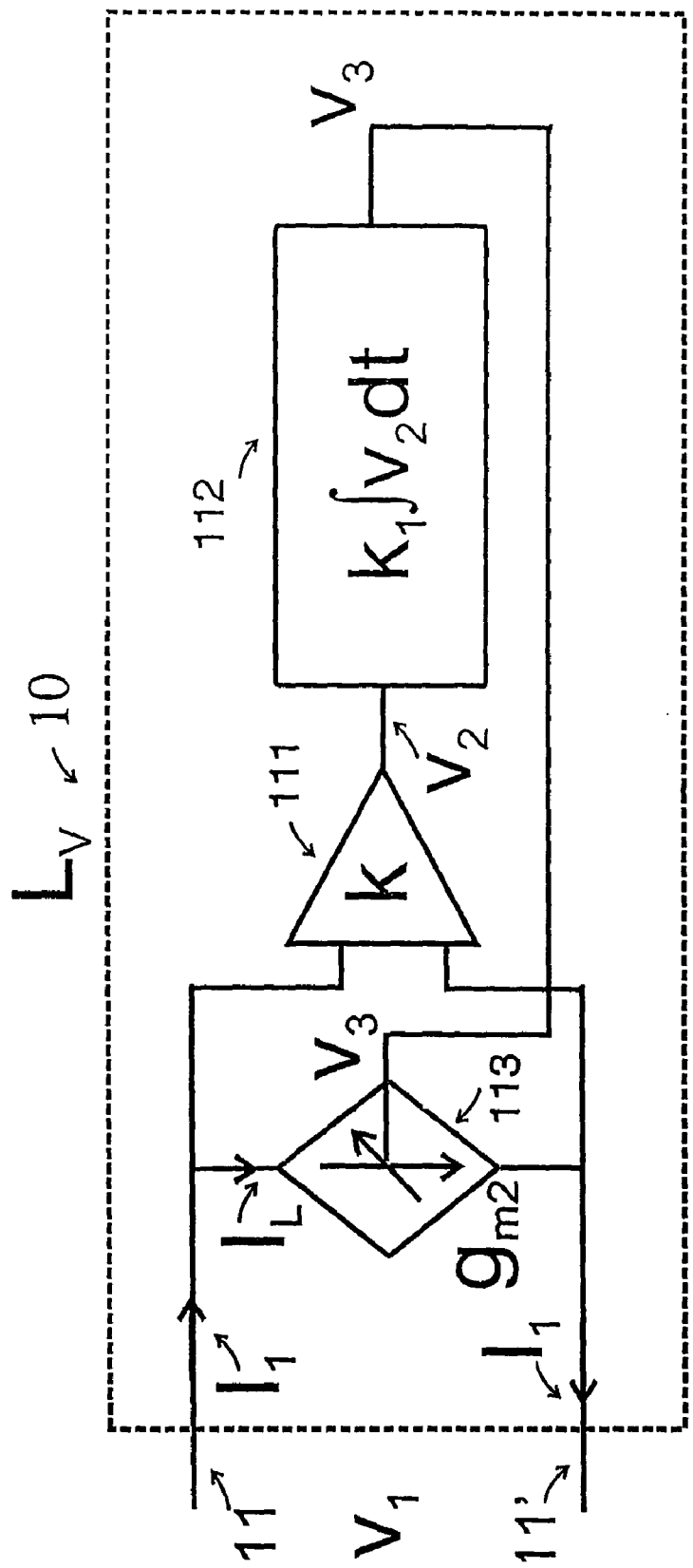
FIG. 4 is a block diagram of a first exemplary implementation of the simulated variable inductor, according to the present invention.

FIG. 4 is a block diagram of a simulated variable inductor $L_V$ 10 in accordance with the second aspect of the invention. The circuit of FIG. 4 comprises a voltage buffer 111, an integrator 112 and a variable transconductor 113. The output voltage $V_1$ of transconductor 113 is connected to the input of voltage buffer 111, whose output $V_2$ is connected to the input of the integrator 112. The output voltage $V_3$ of integrator 112 is connected to the control terminal of transconductor 113.

At its boundary the overall variable inductor $L_V$ 10 has an overall input port 11, 11', at which port the voltage signal $V_1$ and current signal $I_1$ provide the voltage-current relationship of an inductor, so the circuit 10 simulates an inductor and the circuit can be used in circuits in place of an ordinary inductor.

Buffer 111 receives the overall port voltage $V_1$ at its input and provides a scaled version of it $V_2$, $V_2 = kV_1$ where k is a constant, at its output. The integrator block 112 receives $V_2$ at its input and provides a voltage output $V_3$. $V_3$ is given by equation (3).

$$V_3 = k_1 \int V_2 dt \quad (3)$$

The transconductor block 113 receives $V_3$ at its control input and provides a current output $I_L$. The transconductance of 113 is $g_{m2}$. The overall signal current $I_1$ is equal to the transconductor output current $I_L$ plus the input current of buffer 1. Depending on the implementation of the buffer its input current can either be negligible or counted towards part of the capacitive current of a resonator (the latter is explained later). In the case of negligible buffer input current the V-I relationship of port 11 is given by $$I_1 = I_L = g_{m2} \cdot k \cdot k_1 \cdot \int V_1 dt = \frac{1}{L} \int V_1 dt \quad (4)$$

Thus simulated inductance L is given by the inverse of the product of transconductance $g_{m2}$, buffer scaling factor k and the integration coefficient $k_1$.

The integrator provides the basic relationship between an inductor's voltage and current by integrating the input voltage of the circuit 10 to produce a voltage proportional to the current. The transconductor turns that voltage into input current of the circuit 10. As indicated by the symbol for the transconductor, the gain $g_{m2}$ of the transconductor is variable (i.e. controllable) and as can be seen from equation 4 altering the gain alters the inductance of the simulated inductor.

As can be seen from equation (4) the coefficients $g_{m2}$, k and k1 give the gain of the loop formed by the buffer, the inductor and the transconductor and determine the inductance of the simulated inductor. Therefore electronically varying any of the coefficients $g_{m2}$, k and k1 can be used to alter the value of the simulated inductance; each of these is entirely possible but varying $g_{m2}$ is preferred.

The buffer 111 is optional. It provides two functions: separation of the input of the integrator from the input of the circuit 10, and scaling of the input. One circumstance in which scaling is useful is when the inductor is being used in an oscillator. Here the amplitude of the input signal may well be large, approaching the power supply levels. This risks clipping the input of the integrator 112, which is avoided by scaling down (i.e. k<1) the input to the integrator.

As the skilled person knows, the output of an integrator will saturate if there is any DC level in the input or any non-zero offset. Similarly there will be clipping if there are significant amplitudes of low frequencies below the frequencies of interest. Therefore generally the circuit of FIG. 3 will also be provided with circuitry (not shown) to make the integrator unresponsive to those low frequencies and to keep the DC level of its output at a particular level within the output range (generally near the centre). Such circuits are known to the skilled person.

Details of blocks 111, 112 and 113 now follow.

Figure 5B:
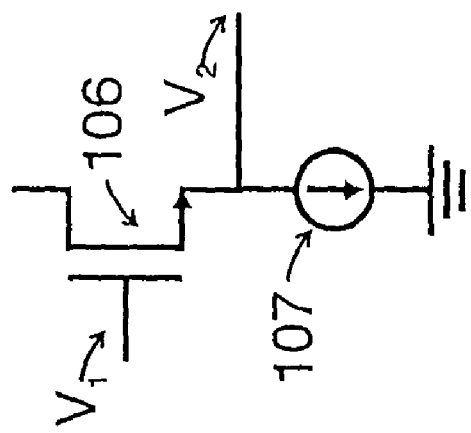
FIG. 5b is a schematic diagram of a second exemplary implementation of a voltage buffer.
Figure 5A:
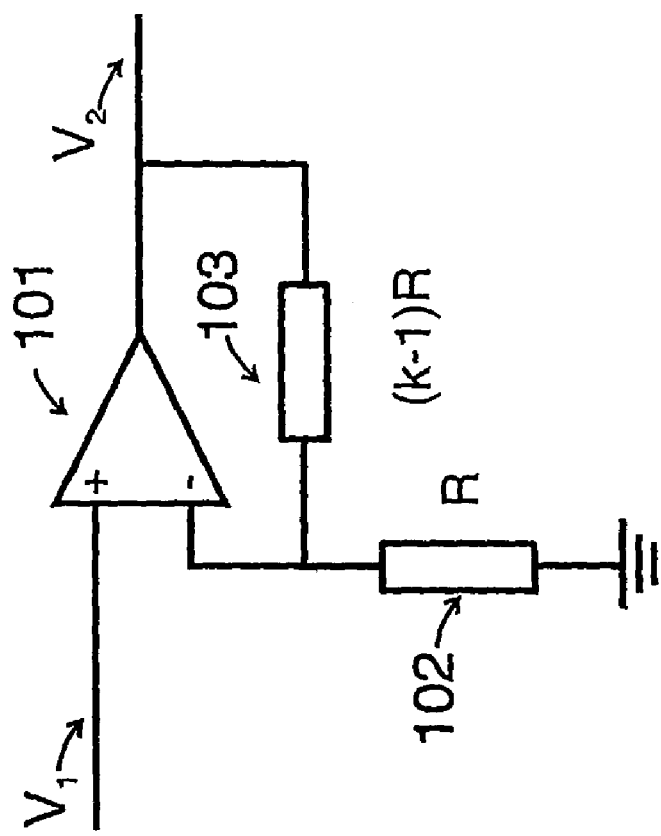
FIG. 5a is a schematic diagram of a first exemplary implementation of a voltage buffer.

Examples of possible implementations of the voltage buffer 111 that draw negligible input current include an op-amp operating in feedback configuration as shown in FIG. 5a or a source-follower as shown in FIG. 5b.

The circuit of FIG. 5a has an operational amplifier 101 having its positive input connected to the input (terminal 11) of the simulated inductor 10 and its negative input connected to the output of the operational amplifier via a first resistor 103 and connected to ground (or terminal 11') via a second resistor 102. The first resistor has a resistance k−1 time that of the second, k being the factor by which the buffer scales the voltage. The output of the operational amplifier provides the output of the buffer.

In the circuit of FIG. 5b the gate of the transistor 106 provides the input of the buffer while the source provides the output. A current source 107 is connected between the source of the transistor and ground to provide the bias current through the channel of the transistor.

Figure 6:
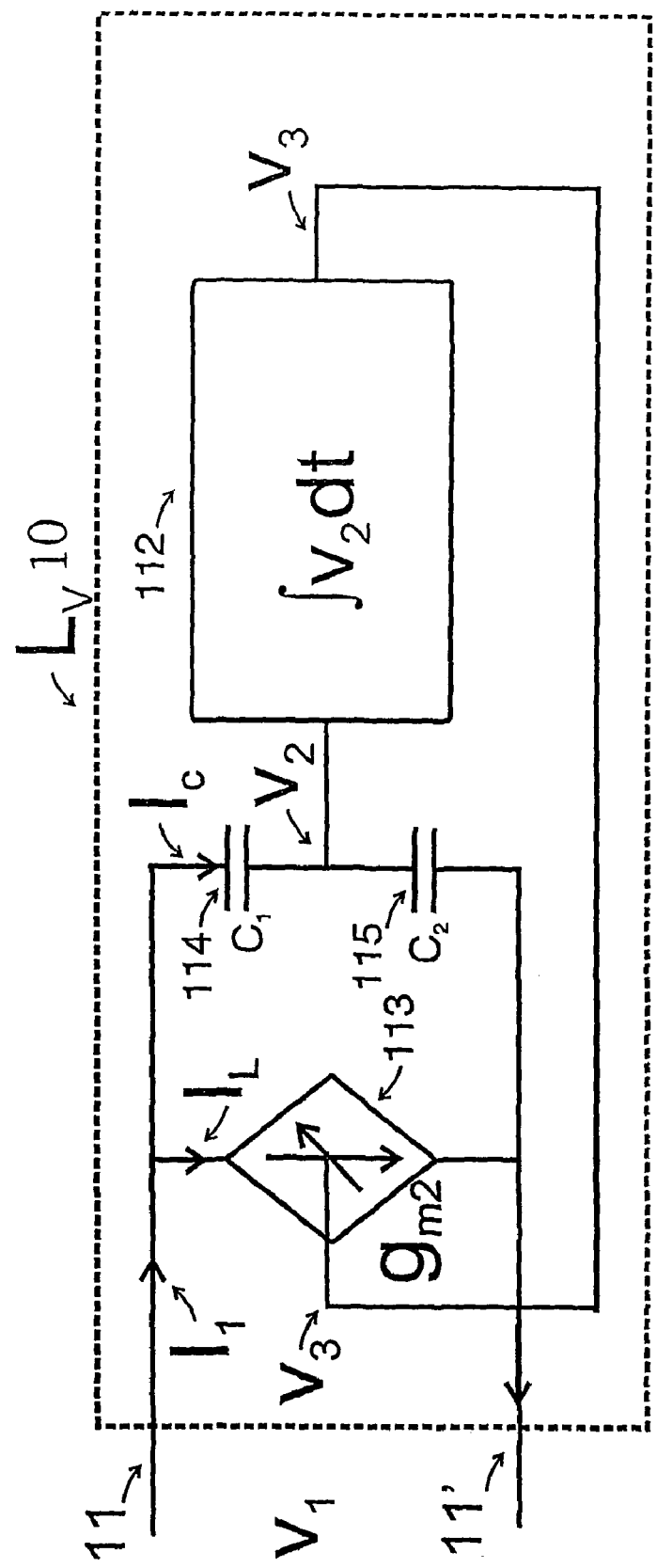
FIG. 6 is a block diagram of a first exemplary implementation of the simulated variable inductor as in FIG. 4, in which an exemplary capacitive implementation of the voltage divider block is shown in schematic form.

A drawback of such buffers is their limited input voltage range, which can be important in modern integrated circuit implementations where the supply voltage is restricted. FIG. 6 shows the circuit of FIG. 4 having an implementation of buffer 111 which does not suffer from that disadvantage. Here the buffer comprises a pair of capacitors 114 and 115 (having capacitances $C_1$ and $C_2$) connected in series between input terminals 11 and 11' to the simulated inductance 10 and forming a capacitive voltage divider, which scales the swing of $V_1$ down to $V_2$ while keeping the two voltages in phase. The voltage scaling reduces the voltage swing at the input of the integrator block 112, which facilitates its realization in modern, low voltage technologies.

In applications where the simulated inductor is part of a resonator, the exemplary buffer implementation can be absorbed into the capacitive part of the resonator, such as the case capacitance of a quartz crystal (see the circuits of FIGS. 9, 10 and 14 described below) or the pair of capacitors in series that form part of the negative resistance generation of Colpitts or Clapp oscillators. The capacitive input current $I_C$ of buffer 111 in these cases counts towards the rest of the resonator so that the inductive relationship between $I_L$ and $V_1$ as described by equation (4) still holds. The division ratio in FIG. 6 can be unity if capacitance $C_1$ is infinite, in which case it can be realized by a short circuit.

FIGS. 7a to 7c show exemplary implementations of the integrator block 112. In FIG. 7a a transconductor 121 converts the input voltage $V_2$ into a current that flows into its load capacitor C 122. The output voltage on the load capacitor, $V_3$, is the integral of the transconductor current and the relationship between $V_2$ and $V_3$ is given by equation (5).

$$V_3 = \frac{1}{C}\int g_{m1} V_2 dt = \frac{g_{m1}}{C}\int V_2 dt \quad (5)$$

FIGS. 7b and 7c show possible implementations that perform approximate integration. The circuit of FIG. 7b has an operational amplifier 125 having its negative input connected to the input of the integrator 112 via a resistor R 123 and to the output of the amplifier via a capacitor C 124. The positive input of the amplifier is connected to ground or a reference level 0. The input resistor R in the circuit of FIG. 7b works well in conjunction with an amplifier-based implementation of buffer 111, but may shift the phase of $V_2$ if buffer 111 is implemented capacitively as in FIG. 6. FIG. 7c shows a simple R-C network implementation of the integrator that works approximately when the RC time constant is far greater than the periods of the signals of interest.

As suggested above electronic control of the inductance L of the simulated inductor can be effected by altering the gain $k_1$ of the inductor. In particular this can be done in the circuit of FIG. 7a by altering the gain $g_{m1}$ of the transconductor 121 or in any of FIGS. 7a, 7b or 7c by electronically altering the capacitance C.

Note also that foe ease of illustration of the relevant concept FIGS. 7a, 7b and 7c have been shown in single ended form but the skilled person will be able to provide circuits having double ended outputs for $V_3$ as is preferred for these examples.

Exemplary implementations of a variable or controlled transconductor block 113 are shown in FIGS. 8a to 8c (which are shown in double ended form).

FIG. 8a shows an exemplary transconductor having a differential pair of transistors biased by a variable current source 143. Its transconductance $g_{m2}$ is controlled by the bias current, which, as previously noted varies the inductance of the simulated inductor. If the current source 143 is implemented with a transistor the bias current it produces is varied by its gate voltage 148, as shown in FIG. 8d. Hence the inductance of the simulated inductor is controlled by a voltage. Alternatively the bias current can be provided by an array of current sources combinable in various combinations by a digital control word to set the value of the effective transconductance, as shown in FIG. 8e. Hence in this case the inductance of the simulated inductor is digitally controlled. If the control signal used to set the inductance is already in the form of a current then current source 143 is not needed as such and the control current can be used directly (suitable scale) to source the current for the transconductor.

FIG. 8b shows a similar transconductor with single-ended output, employing cascode transistors in the output stage to ensure high output resistance. FIG. 8c shows a similar transconductor with single-ended output, employing folded, regulated-cascode transistors in the output stage to ensure high output resistance. Similar circuits can be used, with either fixed or variable transconductance, for the implementation of $g_{m1}$ in FIG. 7a. The output current of 113 is now given by $$\begin{aligned}I_L &= g_{m2} \cdot V_3 \quad (6)\\ &= \frac{g_{m2}}{C}\int g_{m1} V_2 dt \\ &= \frac{g_{m2} \cdot g_{m1}}{C} \frac{C_1}{C_1 + C_2} \int V_1 dt \\ &= \frac{1}{L}\int V_1 dt\end{aligned}$$

The simulated inductance for the exemplary implementation in FIG. 6 is therefore given by $$L = \frac{C \cdot (C_1 + C_2)}{C_1 \cdot g_{m2} \cdot g_{m1}} \quad (7)$$

where the capacitive current $I_C$ drawn by $C_1$ and $C_2$ are attributed to the rest of the resonator.

Figure 9:
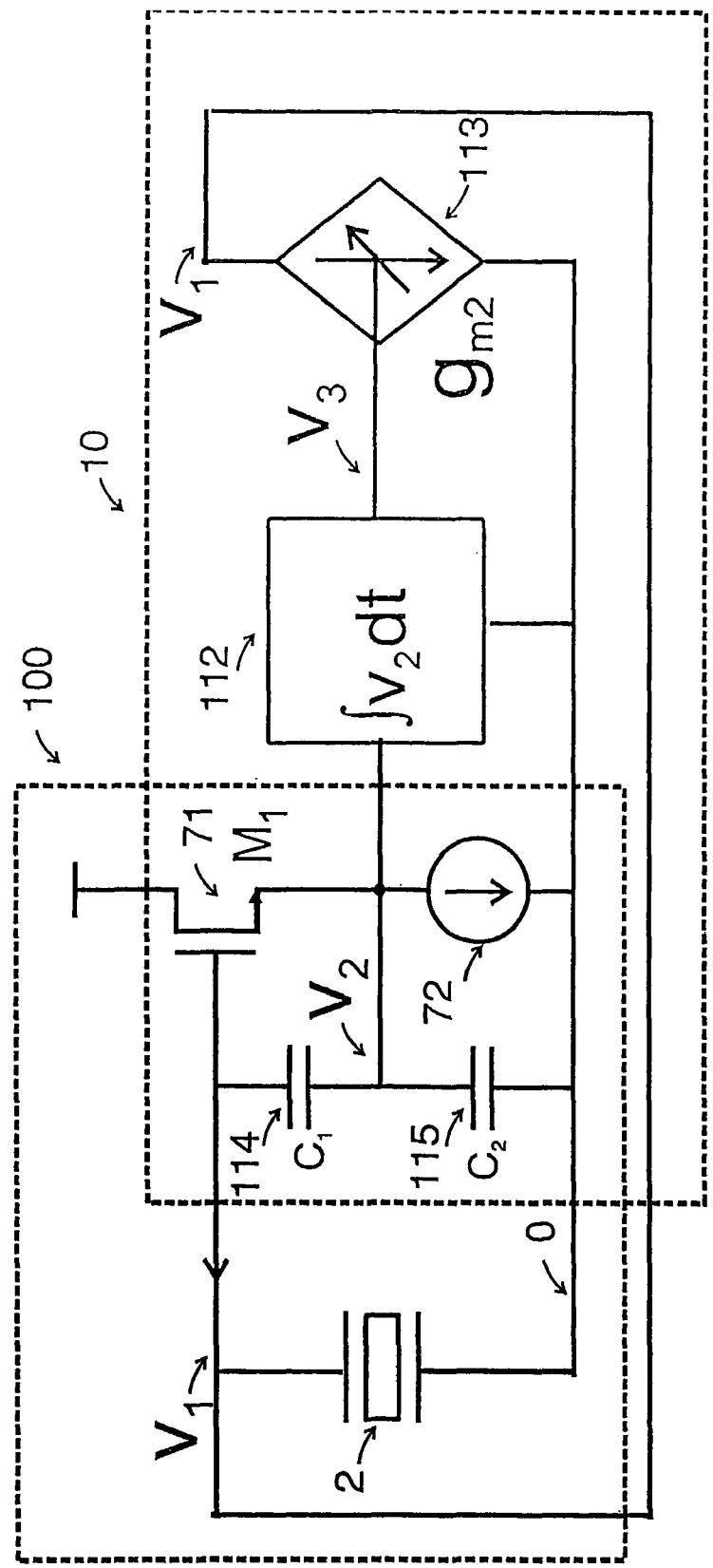
FIG. 9 is a schematic diagram of an exemplary implementation of a frequency-controlled crystal oscillator employing an exemplary implementation of the simulated variable inductor, according the present invention.

FIG. 9 shows an exemplary electronically-controlled crystal oscillator based on the simulated variable inductor.

Capacitors $C_1$ and $C_2$ are combined with transistor $M_1$ 71 and the current sink 72 connected to $M_1$ to form the negative resistance in well-known 3-point oscillators such as Colpitts, Clapp or Pierce oscillators. Those components forming the oscillator are shown in the diagram within box 100.

At the same time the capacitors $C_1$ and $C_2$ constitute part of the parallel capacitance of the crystal resonator, as well as the voltage buffer 111 of the simulated inductor 10 (the components forming the simulated inductor 10 being within the dashed box 10 in FIG. 9). Transistor $M_1$ 71 and current sink 72 also act partially as such a voltage buffer between the signal terminal of the crystal resonator and the integrator 112 of the simulated inductor 10. The remaining part of the simulated inductor circuit comprises the integrator block 112, whose input is connected to the source terminal of $M_1$ and as in the circuit of FIG. 6 to the node between the capacitors $C_1$ and $C_2$, which as before provide the buffer 111 in the form of a capacitive voltage divider, and the transconductor block 113, whose output is fed back to the input of the buffer formed by the capacitors $C_1$ and $C_2$ (and also to the gate of $M_1$ and to the signal terminal of the crystal).

Varying transconductance $g_{m2}$ of the transconductor 113 varies the simulated inductance, thereby varying the oscillation frequency. Since the bias current of transconductor 113 can be varied by either controlling the gate voltage of the current-source transistor or by digitally combining a subset of an array of current sources into a single bias current, voltage-controlled inductance or digitally-controlled inductance can also be realized. The exemplary crystal oscillator implementation in FIG. 9 therefore embodies current-controlled, voltage-controlled or digitally controlled crystal oscillators.

In contrast to connecting a variable capacitor in parallel with the crystal, which decreases its resonant frequency, connecting a simulated variable inductor in parallel with the crystal increases its resonant frequency. The tuning range of a crystal oscillator is therefore increased, beyond that achievable with a variable capacitor by combining variable capacitance with the simulated variable inductance, as shown in the exemplary implementation in FIG. 10, which is the same as that of FIG. 9 except that the capacitors $C_1$ and $C_2$ have been made variable. Since capacitors $C_1$ and $C_2$ already form a necessary part in such 3-point oscillators in parallel with the case capacitance of the crystal, they can also function as variable capacitors, in addition to their role in negative resistance generation and voltage buffering.

It is also possible to have just one of $C_1$ or $C_2$ variable and obtain such a wide-range frequency-controlled crystal oscillator.

Figure 10:
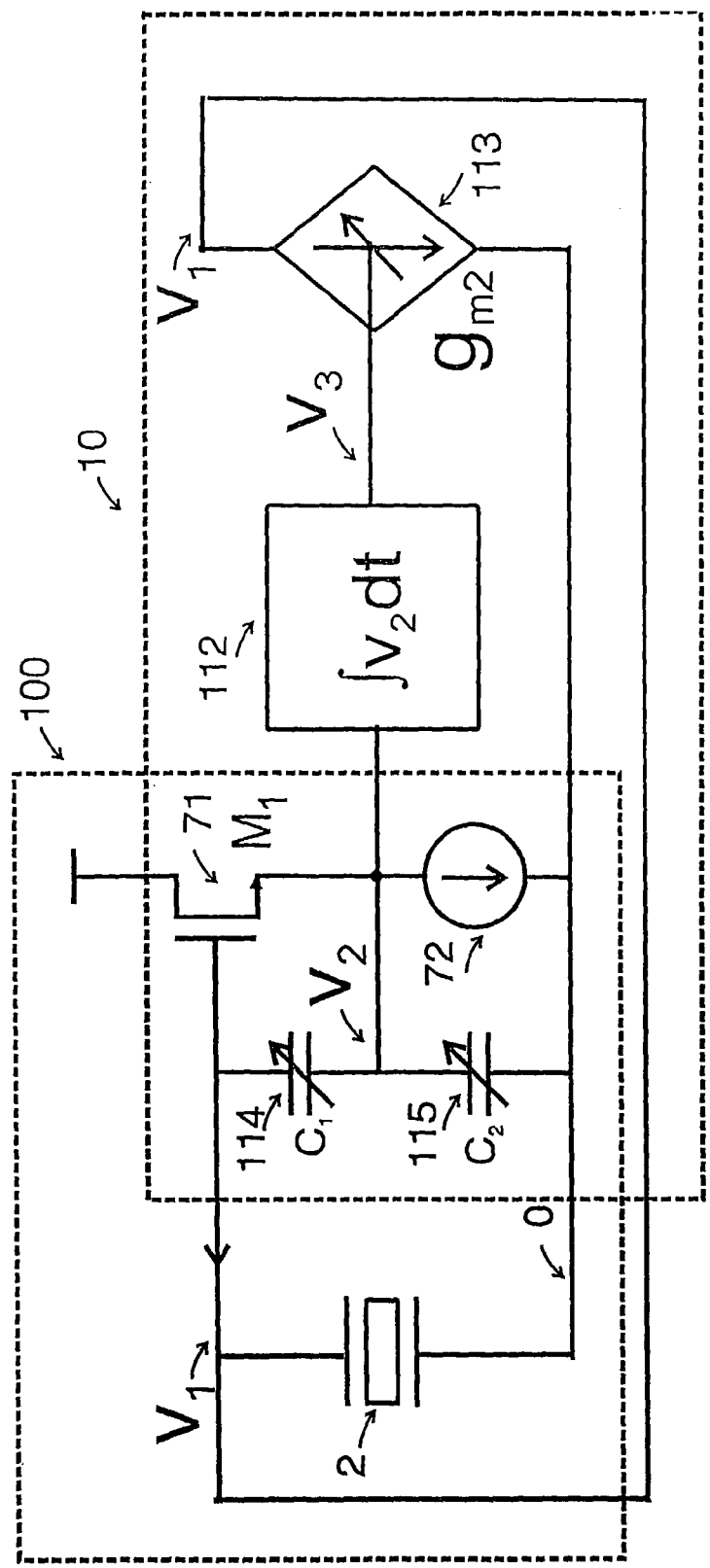
FIG. 10 is a schematic diagram of an exemplary implementation of a frequency-controlled crystal oscillator employing both an exemplary implementation of the simulated variable inductor and variable capacitors, according the present invention.
Figure 11:
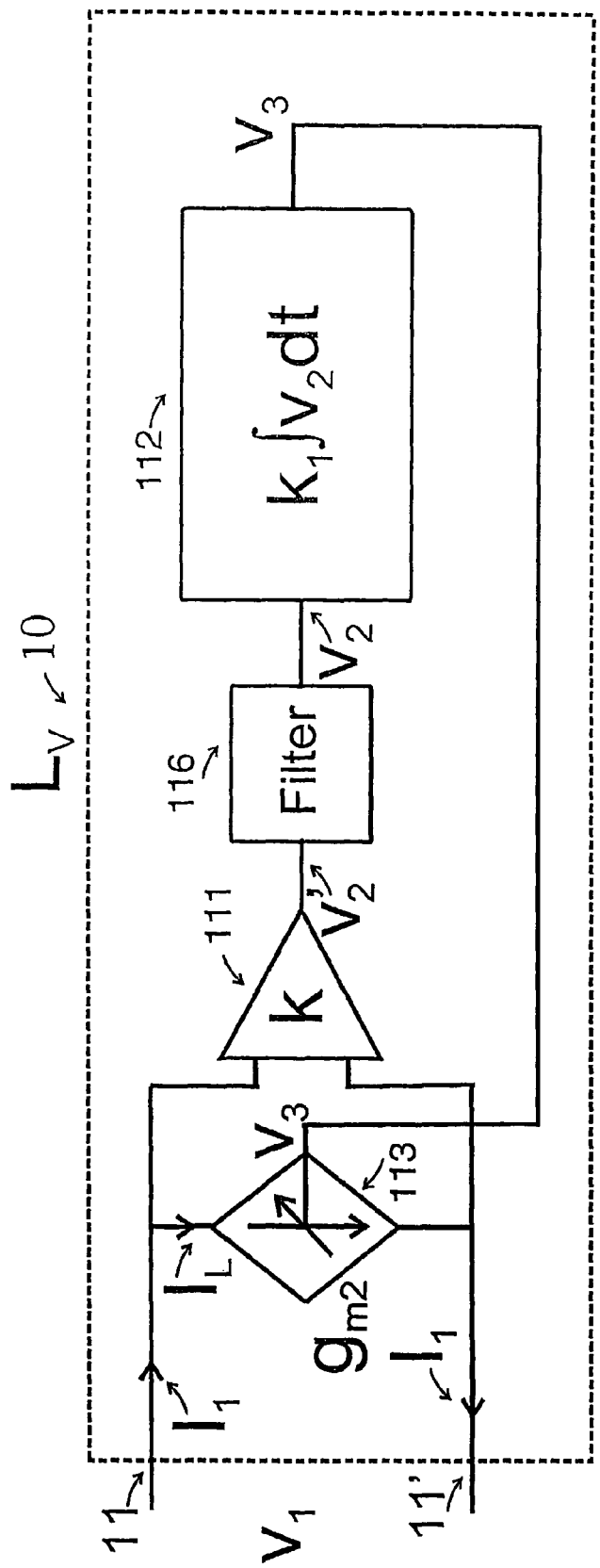
FIG. 11 is a block diagram of a second exemplary implementation of the simulated variable inductor incorporating a filter between the voltage buffer and the integrator, according to the present invention.

A limitation of this frequency-controlled resonator is that, although the simulated inductance can be sufficiently large at or close to the desired resonant frequency, to keep the parallel inductor-capacitor combination as shown in FIG. 3 capacitive (which is needed to keep it from forming an LC loop resonator with the crystal), at lower frequencies the simulated inductance may be small enough to cause the said combined impedance to be inductive, as can be seen from equation (2). In the case of a crystal oscillator as shown in FIG. 9 or 10, this could cause an oscillation to occur at a parasitic frequency lower than the intended resonance. To avoid such parasitic oscillation, the simulated inductor can be prevented from taking on values outside a desired range by incorporating a filter 116 anywhere in the loop formed by the buffer, the integrator and the transconductor, but preferably the filter is inserted between the voltage buffer output and the integrator input as shown in an exemplary implementation in FIG. 11. The said filter can be bandpass, with the passband including the desired working frequency such as the resonant frequency of an oscillator, or highpass, with the corner frequency lower than the intended working frequency but higher than the frequency at which the simulated inductance becomes too low.

Figure 12:
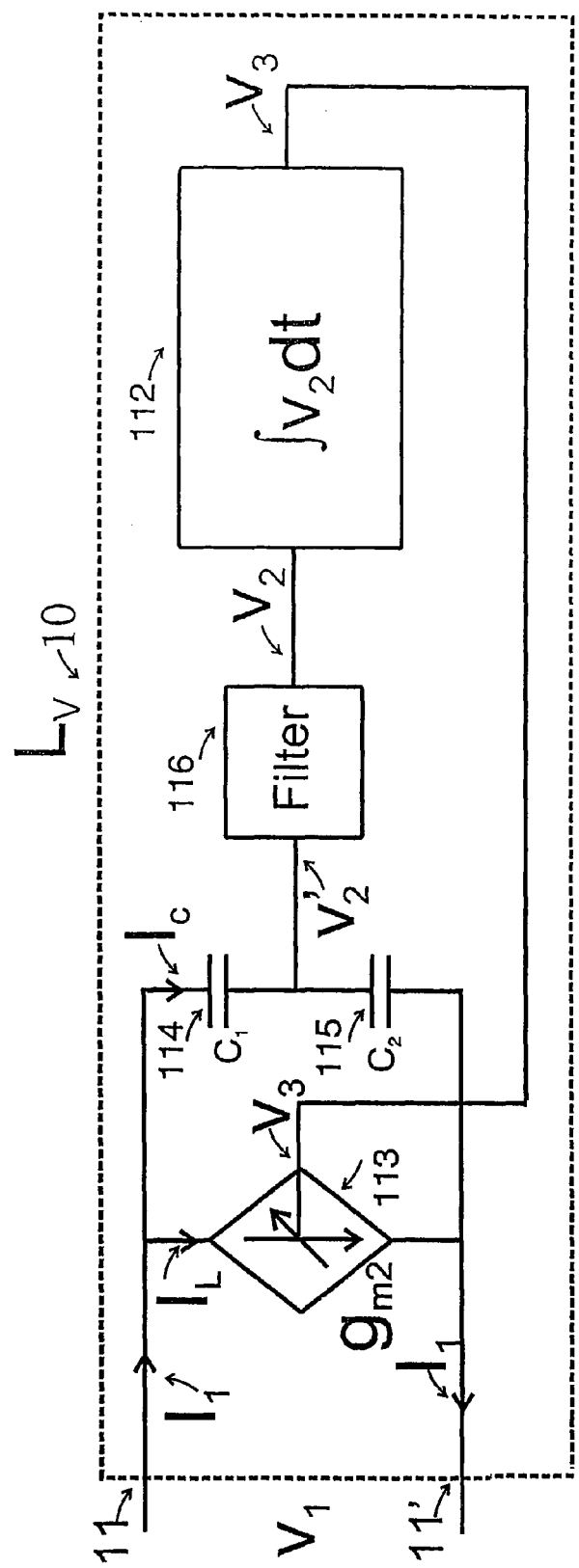
FIG. 12 is a block diagram of a second exemplary implementation of the simulated variable inductor incorporating a filter as in FIG. 11, in which the voltage buffer is implemented capacitively, according to the present invention.
Figure 13:
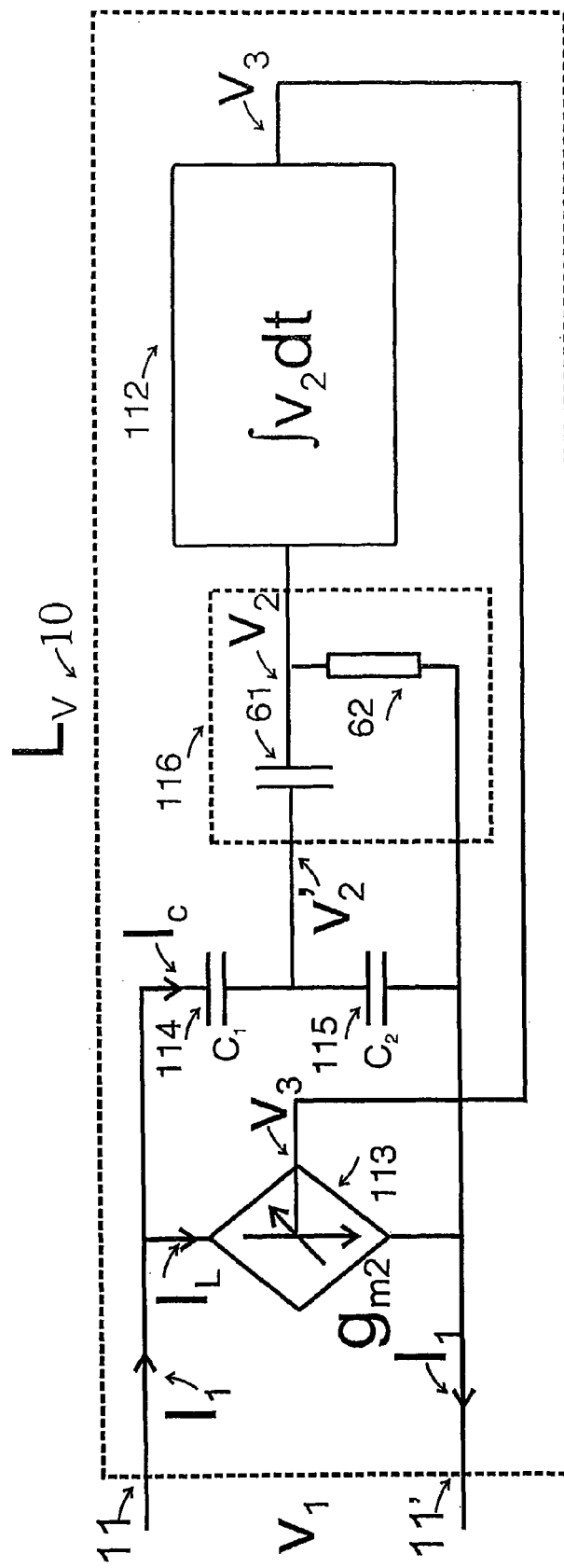
FIG. 13 is a block diagram of the simulated variable inductor as in FIG. 12, in which an exemplary implementation of the filter is shown in schematic form.

FIG. 12 shows an exemplary implementation of the simulated inductor with filter, where the voltage buffer is realized with a capacitive divider. FIG. 13 shows an exemplary implementation of the simulated inductor with filter 116, where the said filter is realized as a first-order highpass filter by capacitor 61 and resistor 62.

Figure 14:
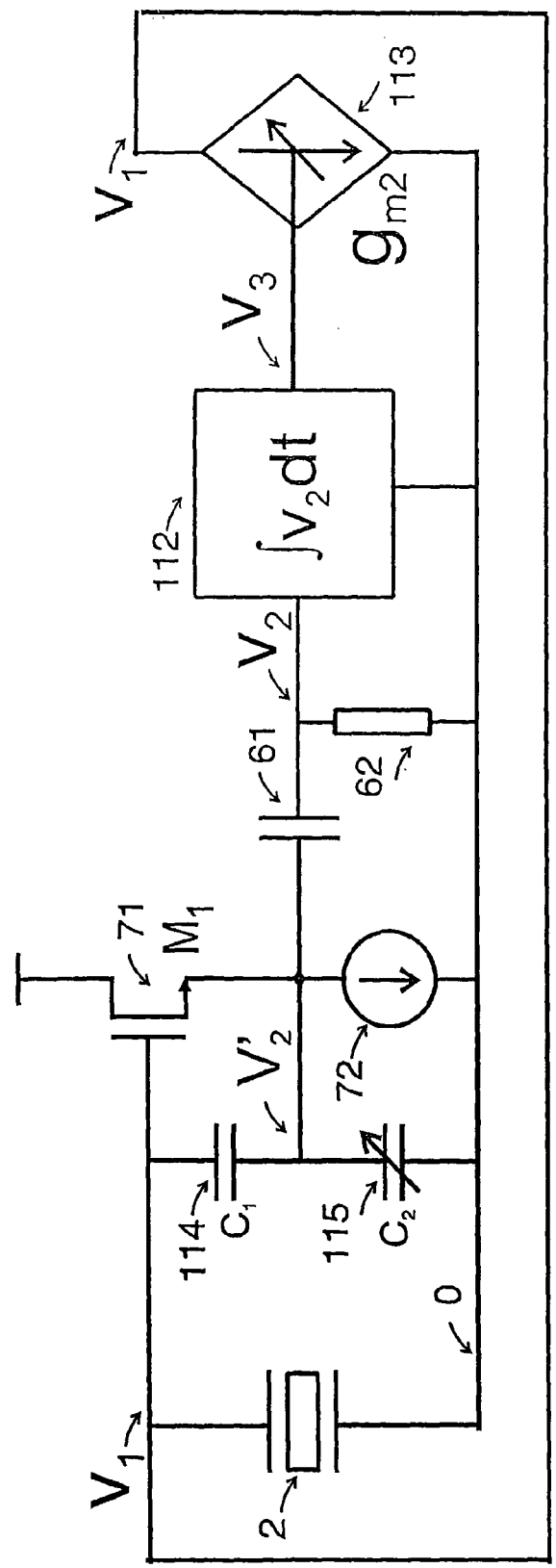
FIG. 14 is a schematic diagram of a frequency-controlled crystal oscillator, employing a variable capacitor and a simulated variable inductor with filter, according to the present invention.

FIG. 14 shows an exemplary implementation of a wide-range adjustable frequency crystal oscillator, where the simulated inductor incorporates a capacitive voltage buffer, with the bottom capacitor being variable (as a varactor, or an array of capacitors, or an array of varactors), and the filter realized as a first-order highpass filter.

The invention claimed is:

1. An electronically variable oscillator circuit comprising:
   a piezoelectric resonator,
   a capacitance connected in parallel with the piezoelectric resonator, the capacitance comprising two capacitances connected in series, and
   an electronically variable simulated inductor connected in parallel with the piezoelectric resonator and the capacitance that comprises the two capacitances connected in series, the electronically variable simulated inductor comprising:
   a simulated inductor input comprising first and second input terminals, the two capacitances being connected in series between the first and second input terminals,
   an integrator having an integrator input connected to receive a scaled version of the voltage present at the simulated inductor input from a node between the two capacitances and being responsive to the voltage present at the simulated inductor input to provide a voltage signal that is an integrated version of the voltage signal at the integrator input; and
   a transconductor having controlled current terminals connected to the simulated inductor input and a control terminal connected to receive the signal output by the integrator, and being responsive to the signal output by the integrator to control the current passed by the controlled current terminals,
   wherein a gain around a loop that includes the integrator and the transconductor is variable in response to an electronic control signal.

2. An electronically variable oscillator circuit as claimed in claim 1 wherein the capacitance is electronically variable.

3. An electronically variable oscillator circuit as claimed in claim 1 wherein a gain of the transconductor is variable in response to an electronic control signal.

4. An electronically variable oscillator circuit as claimed in claim 3 wherein the transconductor is variable in response to a voltage signal.

5. An electronically variable oscillator circuit as claimed in claim 3 wherein the transconductor is variable in response to a digital signal.

6. An electronically variable oscillator circuit as claimed in claim 3 wherein the transconductor is variable in response to a current signal.

7. An electronically variable oscillator circuit as claimed in claim 1 comprising a filter connected between the node between the two capacitances and the integrator input.

8. An electronically variable oscillator circuit as claimed in claim 1 comprising a filter connected at a point in a loop that includes the integrator and the transconductor, the filter being a highpass or bandpass filter.

* * * * *